United States Patent
Achtenhagen et al.

(10) Patent No.: US 8,548,022 B2
(45) Date of Patent: Oct. 1, 2013

(54) SINGLE-FREQUENCY DISTRIBUTED FEEDBACK LASER DIODE WITH COMPLEX-COUPLING COEFFICIENT AND TRANSPARENT CONDUCTIVE CLADDING LAYER

(76) Inventors: Martin Achtenhagen, Plano, TX (US); Cheryl Achtenhagen, legal representative, Plano, TX (US); Nuditha Vibhavie Amarasinghe, Richardson, TX (US)

( * ) Notice: Subject to any disclaimer, the term of this patent is extended or adjusted under 35 U.S.C. 154(b) by 0 days.

(21) Appl. No.: 13/455,860

(22) Filed: Apr. 25, 2012

(65) Prior Publication Data

US 2013/0022073 A1    Jan. 24, 2013

Related U.S. Application Data

(60) Provisional application No. 61/509,461, filed on Jul. 19, 2011.

(51) Int. Cl.
    *H01S 5/00* (2006.01)
(52) U.S. Cl.
    USPC .................... 372/45.01; 372/50.11
(58) Field of Classification Search
    USPC ........................... 372/45.01, 50.11
    See application file for complete search history.

(56) References Cited

U.S. PATENT DOCUMENTS

| 6,829,277 | B2 * | 12/2004 | Yatsu et al. | 372/49.01 |
| 2003/0039285 | A1 * | 2/2003 | Yatsu et al. | 372/45 |

OTHER PUBLICATIONS

J. Buus, Mode Selectivity in DFB Lasers with Cleaved Facets, Electron Lett. 21, (1985) pp. 179-180.
H. Kogelnik and C.V. Shank, Coupled-mode Theory of Distributed Feedback Lasers, J. Appl. Phys., vol. 42, No. 5, (1972) pp. 2327-2335.
K. Utaka, S. Akiba, K. Sakai and Y. Matsushima, Effect of Mirror Facets on Lasing Characteristics of Distributed Feedback InFaAsP/InP Laser Diodes at 1.5 μm Range, IEEE Journal of Quantum Electronics, vol. 20, Issue 3 (1984) pp. 236-245.
E. Kapon, A. Hardy and A. Katzir, The Effect of Complex Coupling Coefficients on Distributed Feedback Lasers, IEEE J. Quantum Electron., vol. 18, No. 1 (1982) pp. 66-71.
Y. Lou, Y. Nakano, K. Tada, et al., Purely Gain-coupled Distributed Feedback Semiconductor Lasers, Appl. Phys. Lett., vol. 56 (1990) pp. 1620-1622.
M. Achtenhagen, R.O. Miles and F.K. Reinhart, Localized Saturation of Loss Grating in Complex-Coupled DFB Laser Diodes, IEEE Photon. Electron. Lett. 8(11), (1996) pp. 1432-1434.
F.K. Reinhart, W. Robert Sinclair, R.A. Logan, Single Heterostructure AlxGA1-xAs Phase Modulator with SnO2-doped In2O3 Cladding Layer, Appl. Phys. Lett. 29(1), (1976) pp. 21-23.
N.S. Takahashi, Y. Hunyu, E. Shibano, N. Mochizuki, S. Kurita, Double-Heterostructure Indium-Tin Oxide/InGaAsP/AlGaAs Lasers, Cryst. Res. Technolo., 28(5), (1993) pp. 711-716.
C.-W. Li, Y.-X. Zhu, G.-D. Shen, Y.-H. Zhang, Y. Qin, W. Gao, W.-J. Jiang, and D.-S. Zhou, Improving performance of ITO/GaP Contact on ALGaInP Light-Emitting Diodes, Chin. Phys. B, 19(9), (2010), pp. 097305-1:5.
M. Achtenhagen, Experimental and Theoretical Stability Analysis of Complex-Coupled DFB Laser Diodes with and without External Feedback, Thesis No. 1475, Swiss Federal Institute of Technology, Lausanne, Switzerland (1996).

* cited by examiner

*Primary Examiner* — Kinam Park
(74) *Attorney, Agent, or Firm* — Schultz & Associates, P.C.

(57) ABSTRACT

The illustrated embodiments provide a system and a method of manufacture for a complex-coupled distributed feedback laser diode. The improved laser diode has a complex-coupled metal grating to enforce the laser to emit in a longitudinal single-frequency and suppress dynamical instabilities. In addition, the improved device uses a transparent conductive cladding layer over the metal grating and makes therefore the need for re-growth redundant.

14 Claims, 8 Drawing Sheets

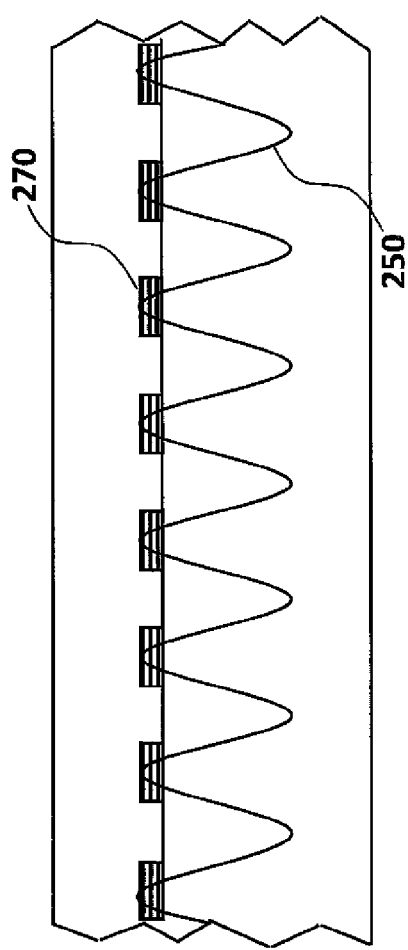
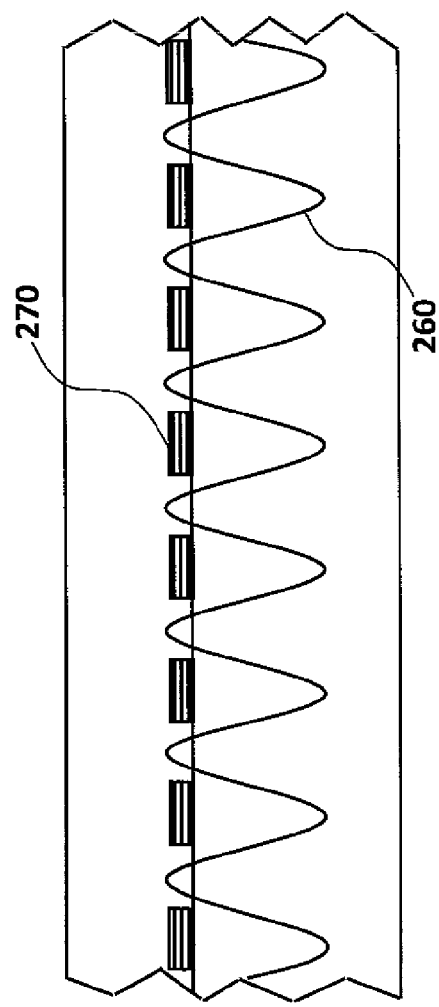

SINGLE-FREQUENCY DISTRIBUTED FEEDBACK LASER DIODE WITH COMPLEX-COUPLING COEFFICIENT AND TRANSPARENT CONDUCTIVE CLADDING LAYER

CROSS-REFERENCE TO RELATED APPLICATION

This application claims priority benefit from U.S. Provisional Application No. 61/509,461 filed Jul. 19, 2011.

FIELD OF THE INVENTION

The present invention relates to distributed feedback laser diode system and a process for making a distributed feedback laser diode system.

BACKGROUND OF THE INVENTION

The illustrative embodiments relate generally to semiconductor lasers. Still more particularly, the illustrative embodiments relate to a system and a method of manufacture for a semiconductor laser incorporating a complex-coupled grating for feedback and a transparent conductive cladding layer for carrier and optical confinement.

A semiconductor laser is a laser in which the active medium is a thin layer of semiconductor, called quantum well. A common type of semiconductor laser is formed from a p-n structure, a region where a thin quantum well layer is embedded between p-type and n-type semiconductors layers, and powered by injected electrical current. As in other lasers, the gain region of the semiconductor laser is surrounded by an optical cavity. An optical cavity is an arrangement of mirrors that forms a standing wave cavity resonator for light waves. Optical cavities surround the gain medium and provide feedback of the laser light. In a simple form of semiconductor laser, for example a laser diode, an optical waveguide may be formed in epitaxial layers, such that the light is confined to a relatively narrow area perpendicular to the direction of light propagation.

Many typical semiconductor lasers are "edge-emitting" lasers which are also called "in-plane" lasers. In edge-emitting lasers, the laser light propagates parallel to the wafer surface of the semiconductor chip and is partially reflected and coupled out at the cleaved edges.

A distributed feedback (DFB) laser diode is a structure formed from multiple layers of alternating materials with a varying refractive index or by periodic variation of some characteristic, such as height of a material, resulting in periodic variation in the effective refractive index in the material. Each boundary of variation causes a partial reflection of an optical wave. These variations in height look visually like stripes and are referred to herein as stripes. When the many reflections combine by constructive interference, high reflectivity over a narrow wavelength range is achieved.

Distributed feedback laser diodes are considered as the preferred devices when it comes to the spectral properties as single-mode emitters. They combine two important laser properties: a narrow spectral line width and high power. They are ideal candidates when it comes to stability and scalability for high-volume production. The monolithic integration of the grating structure within the gain region results in a compact and stable laser cavity. As a consequence the wavelength can be linearly and continuously tuned over an extended range by the injection current and temperature. There are no mode jumps or mode transitions during wavelength tuning as opposed to distributed Bragg reflector (DBR) lasers, which is a vital requirement for locking under autonomous operation.

Albeit all these properties, properly designed and manufactured short wavelength DFB lasers especially in the 0.6 μm to 1.2 μm wavelength range are currently not available. Today's DFB lasers show a very limited lifetime and may develop spectral ambiguities over time. The physical reasons are well known and understood, but not yet properly addressed.

One of the problems of conventional DFB laser design is to support sufficient mode selectivity as shown, for example, in the article by J. Buus, *Mode selectivity in DFB lasers with cleaved facets*, Electron. Lett., 21, 179-180 (1985). Employing a periodic index corrugation has an inherent problem in existence of two longitudinal modes across a laser stop band, a right propagating Bragg mode and a left propagating Bragg mode, having equal threshold gain. It inevitably results in poor single-mode operation as shown, for example, in the article by H. Kogelnik and C. V. Shank, *Coupled-mode theory of distributed feedback lasers*, J. Appl. Phys., vol. 43, no. 5, pp. 2327-2335 (1972).

Common ways to overcome this degeneracy problem is the use of an asymmetric structure with one end cleaved or (high reflective) HR coated and the other end (anti reflective) AR coated as shown, for example, in the publication by K. Utaka, S. Akiba, K. Sakai and Y. Matsushima, *Effect of Mirror Facets on Lasing Characteristics of Distributed Feedback InGaAsP/InP Laser Diodes at 1.5 μm Range*, IEEE Journal of Quantum Electronics, vol. 20, issue 3, pp. 236-245 (1984). The performance of such DFB lasers then depends on the exact, but random position of the cleavage relative to the internal grating. Therefore proper devices are selected according to their spectral behavior.

Asymmetric coating of facets of the laser results in asymmetric losses for two degenerate longitudinal modes, and consequently in different threshold gains for these modes. The final single-mode yield in such lasers, however, is relatively low because of the random facet phases introduced by cleaving.

Over time the phase of the internal field is going to change and with it the spectral properties. During aging the material properties of the DFB section are changing. As a consequence, the phase of the internal field is also changing and therefore the phase conditions at the boundaries. However, these phase conditions, which determine the mode selectivity and single-mode operation of these devices, depend upon the initial conditions and the aging process of the device. The aging process of each individual device is different and unpredictable, which makes conventional DFB lasers unreliable for applications requiring continuous locking over an extended period of time.

It was proposed to include a so-called quarter wave shift (QWS) in the middle of the laser cavity in order to overcome the phase issues as shown, for example, by K. Utaka, S. Akiba, K Sakai, and Y. Matsushima, *λ/4-Shifted InGaAsP/InP DFB Lasers*, IEEE J. Quantum Electron. 22, 1042 (1986). The output power of these lasers is relatively low. Due to the laser symmetry, half of the power is emitted and wasted from the other laser facet. Moreover, a phenomenon known as spatial-hole burning induced by the QWS limits the maximum output power and negatively affects the reliability of the devices.

Introducing periodic optical gain or loss sections (loss coupling or gain coupling) in the presence of conventional index corrugation along the laser cavity effectively breaks the mode degeneracy between the two Bragg modes around the stop band of the DFB lasers, and thus avoids a serious and inherent problem for conventional index-coupled DFB lasers, as predicted by E. Kapon, A. Hardy, and A. Katzir in the publication *The Effect of Complex Coupling Coefficients on Distributed Feedback Lasers*, IEEE J. Quantum Electron., vol. 18, no. 1, pp. 66-71 (1982). These complex-coupled DFB lasers have been demonstrated, for example, in the publication by Y. Luo, Y. Nakano, K. Tada et al., *Purely gain-coupled distributed feedback semiconductor lasers*, Appl. Phys. Lett., vol. 56, pp. 1620-1622 (1990). These lasers effectively demonstrated lasing predominantly on a preferred and fixed Bragg mode among the two originally degenerate ones around the stop band, regardless of random distribution of unknown laser facet phases.

These complex-coupled DFB lasers, however, show a dynamically unstable operation behavior, which was attributed to the saturable absorption of the loss grating as shown, for example, by M. Achtenhagen, *Experimental and Theoretical Stability Analysis of Complex-Coupled DFB Laser Diodes with and without External Feedback*, Thesis no. 1475, Swiss Federal Institute of Technology, Lausanne (1996).

As all other laser diodes, loss-coupled DFB laser diodes undergo aging affects. In principle it is possible that, due to the aging effects, the overlap with the loss regions might change over time and a mode transition may evolve. Prior to a possible mode transition, however, the threshold current of the lasing mode will increase, which in turn is easily detectable as shown, for example, by M. Achtenhagen, R. O. Miles, and F. K. Reinhart, *Localized Saturation of Loss Grating in Complex-Coupled DFB Laser Diodes*, IEEE Photon. Electron. Lett., 8(11), 1432-1434 (1996). This increase in threshold current allows monitoring and prediction of a possible mode transition prior to the transition.

In the early 1976, F. K. Reinhart et al. used sputtered ITO as a cladding layer in a phase modulator as shown, for example, in the article by F. K. Reinhart, W. Robert Sinclair, and R. A. Logan, *Single heterostructure $Al_xGa_{1-x}As$ phase modulator with $SnO_2$-doped $In_2O_3$ cladding layer*, Appl. Phys. Lett., 29(1), 21-23 (1976). In 1993, the first heterostructure lasers were demonstrated by N. S. Takahashi et al. using ITO as a cladding layer as shown, for example, in the article by N. S. Takahashi, Y. Hunyu, E. Shibano, N. Mochizuki, S. Kurita, *Double-Heterostructure Indium-Tin Oxide/InGaAsP/AlGaAs Lasers*, Cryst. Res. Technol., 28(5), 711-716 (1993). In the meantime ITO has been used for a variety of applications. Recently, it was thoroughly studied as a transparent contact layer for light emitting diodes as shown, for example, in the article by C.-W. Li, Y.-X. Zhu, G.-D. Shen, Y.-H. Zhang, Y. Qin, W. Gao, W.-J. Jiang, and D.-S. Zhou, *Improving performance of ITO/GaP contact on AlGaInP light-emitting diodes*, Chin. Phys. B, 19(9), 097305-1:5 (2010).

What is needed is an improved complex-coupled DFB laser with refractive index and non-saturable loss grating to enforce the laser to emit in a single-frequency and suppress dynamical instabilities. In addition, a manufacture method that reduces processing time and avoids the incorporation of detrimental defects in the epitaxial structure, especially in GaAs material systems for DFB lasers, is needed. The present invention addresses these needs.

SUMMARY OF THE INVENTION

The illustrated embodiment provides a system and a method of manufacture for a distributed feedback semiconductor laser device including a metal grating and a transparent conductive cladding layer. The improved laser has a refractive index and non-saturable loss grating to enforce the laser to emit in a single-frequency and suppress dynamical instabilities. In addition, the improved device uses a transparent conductive cladding layer over the metal grating and makes therefore the need for re-growth redundant.

Disclosed is a single frequency complex-coupled distributed feedback semiconductor (CC-DFB) laser device having a single optical lasing mode along an optical axis, comprising a substrate having a first metal conductive layer on an exterior side and a first cladding region on an interior side, a first barrier region adjacent the first cladding region, an active region adjacent the first barrier region comprising at least one quantum well, a second barrier region adjacent the active region, a second cladding region adjacent the second barrier region including a cap layer, a complex-coupled grating adjacent the cladding region further comprising a set of periodically placed metal stacks, a third cladding region adjacent the complex-coupled grating and the second cladding region comprising a non-epitaxially grown transparent and conductive material, a second metal conductive layer adjacent the third cladding region. The CC-DFB laser device includes a means for providing lateral carrier confinement and a means for providing lateral optical confinement and vertical optical confinement for the single optical lasing mode.

In the preferred embodiment, the lateral carrier confinement and the lateral optical confinement is provided by a dielectric material placed laterally adjacent to a ridge structure formed along the optical axis in the second cladding region. The vertical optical confinement is accomplished by partial impurity diffusion in the first cladding region, the first barrier region, the second barrier region and the second cladding region.

In a first embodiment, the substrate is GaAs and the first cladding layer, second cladding layer, first barrier region, and second barrier region include AlGaAs. The first embodiment CC-DFB laser device is capable of generating light in the wavelength range of 0.6 micrometers to 1.2 micrometers.

In a second embodiment, the substrate is InP and the first cladding layer, second cladding layer, first barrier region, and second barrier region include InGaAsP. The second embodiment CC-DFB laser device is capable of generating light in the wavelength range of 1.3 micrometers to 1.6 micrometers.

In a third embodiment, the substrate is one of the group of GaN, Sapphire and II-VI compounds and is capable of generating light in the wavelength range of 0.3 micrometers to 0.5 micrometers.

In the preferred embodiment, the substrate and first cladding layer are N-doped and the second cladding layer is P-doped, the dielectric material is SiN, the third cladding layer is ITO, and each metal stack in the set of periodically placed metal stacks comprises a titanium layer, a chrome layer and a gold layer.

In an alternate embodiment the substrate and first cladding layers are P-doped, the second cladding layer is N-doped.

A process for manufacturing a CC-DFB laser device is disclosed for a device comprising a non-saturable grating and including a plurality of metal layers, the method comprising the first step of growing epitaxial layers on a substrate wafer having a first surface with adjacent layers above including a base substrate layer, a lower cladding layer, a first barrier layer, an active layer, a second barrier layer and an upper cladding layer including a cap layer. In a second step a ridge structure is fabricated by removing a volume of the upper cladding layer and depositing a dielectric material to fill the removed volume and in a third step a grating structure is fabricated comprising a periodic set of metal stacks above the ridge structure to contact the cap layer and the dielectric material. In the fourth step, a transparent and conductive cladding layer is fabricated adjacent and above the grating structure and above the cap layer and the dielectric material. A first metal layer is then deposited over the transparent and conductive cladding layer, followed by fabricating a metal contact layer over the first metal layer. The first surface is lapped and polished and a second metal layer deposited thereon and annealed. The resulting wafer is diced and cleaved into a set of laser devices.

In another aspect of the preferred method of manufacture, the step of fabricating the ridge structure further comprises the steps of depositing a layer of photoresist over the second cladding layer, exposing the layer of photoresist through a mask to define the ridge structure, developing and baking the layer of photoresist, removing the volume of the second cladding layer by a wet-etch process to leave a resulting surface, depositing the dielectric material over the resulting surface, and removing residual photoresist from the layer of photoresist by a lift-off process to expose the ridge structure.

In another aspect of the preferred method of manufacture, the step of fabricating the grating structure further comprises the steps of spinning a layer of PMMA above the cap layer and the dielectric material, baking the layer of PMMA; writing a periodic pattern of stripes into the PMMA; baking the written PMMA; developing the written PMMA; depositing a metal stack over the developed PMMA, and performing a lift-off process to leave behind the grating structure as a periodic set of metal stacks in contact with the cap layer.

In yet another aspect of the preferred method of manufacture, the step of fabricating the transparent and conductive cladding layer and fabricating a first metal layer over the transparent and conductive cladding layer comprises the steps of depositing a layer of photoresist over the grating structure, cap layer and dielectric material, baking the layer of photoresist, exposing the layer of photoresist through a mask to define a laser device pattern, removing unexposed photoresist with a developer to leave a resulting surface, sputtering a transparent and conductive material over the resulting surface, and depositing the first metal layer over the sputtered transparent and conductive material.

In another aspect of the method of manufacture, the step of fabricating a metal contact layer includes the steps of depositing a thin layer of photoresist over the first metal layer, exposing the thin layer of photoresist through a mask to define a contact pattern, removing unexposed photoresist from the thin layer of photoresist to expose the contact pattern, depositing the metal contact layer in contact with first metal layer using an electro-plating process, and, removing residual photoresist from the thin layer of photoresist in a lift-off process to leave the metal contact layer with the contact pattern.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 4A shows an internal standing-wave having a large overlap with metal regions of a loss grating.

FIG. 4B shows an internal standing-wave having a minimum overlap with metal regions of a loss grating.

DETAILED DESCRIPTION

The illustrated embodiment provides a system and a method of manufacture for a complex-coupled DFB laser with a transparent conductive cladding layer. The illustrative embodiments provide an improved complex-coupled distributed feedback laser comprising a metal grating and an indium tin oxide cladding layer.

Materials suitable for laser devices are III-V semiconductors, consisting of materials in columns III and V of the periodic table. Examples of column-III atoms include aluminum (Al), gallium (Ga), indium (In), and thallium (Tl), and examples of column-V atoms are nitrogen (N), phosphorus (P), arsenic (As), and antimony (Sb). Semiconductor lasers in the near infrared and extending into the visible may be based on GaAs/AlGaAs layers. Indium phosphide (InP) may be used to produce lasers in the 1.3 μm and 1.5 μm wavelength region with InP/InGaAsP layered materials. Gallium nitride (GaN) may be used for blue and ultraviolet lasers.

The structures can be grown by either molecular beam epitaxy (MBE) or metal-organic chemical vapor deposition (MOCVD) to control the layer composition and thickness down to mono layers of atoms. Other materials within the scope of the illustrative embodiments are based on II-VI compounds. Examples of column-II atoms are zinc (Zn) and cadmium (Cd). Examples of column-VI atoms are sulfur (S), selenium (Se), and tellurium (Te). An example II-VI compound is zinc selenide (ZnSe) which may be used for blue-green lasers. Many more compounds may be used for semiconductor lasers, producing lasers of various wavelengths and all of them are within the scope of the present invention.

The processing time for producing laser diode devices is reduced significantly by avoiding a second growth step, i.e. re-growth. The elimination of re-growth also reduces the incorporation of detrimental defects in the epitaxial structure especially in GaAs material systems. A novel solution is to grow non-epitaxially, a transparent and conductive layer over the grating region, which is fast and eliminates the expensive re-growth step. This transparent and conductive layer is part of the upper cladding layer and confines the internal cavity mode.

Suitable materials that have the required properties for and can serve as a transparent and conductive upper cladding layer include ITO (Indium-Tin oxide), NiO, GZO, IZO, graphene and AZO. In the preferred embodiment, the transparent and conductive upper cladding layer is transparent at a wavelength of about 780 nm.

Figure 1:
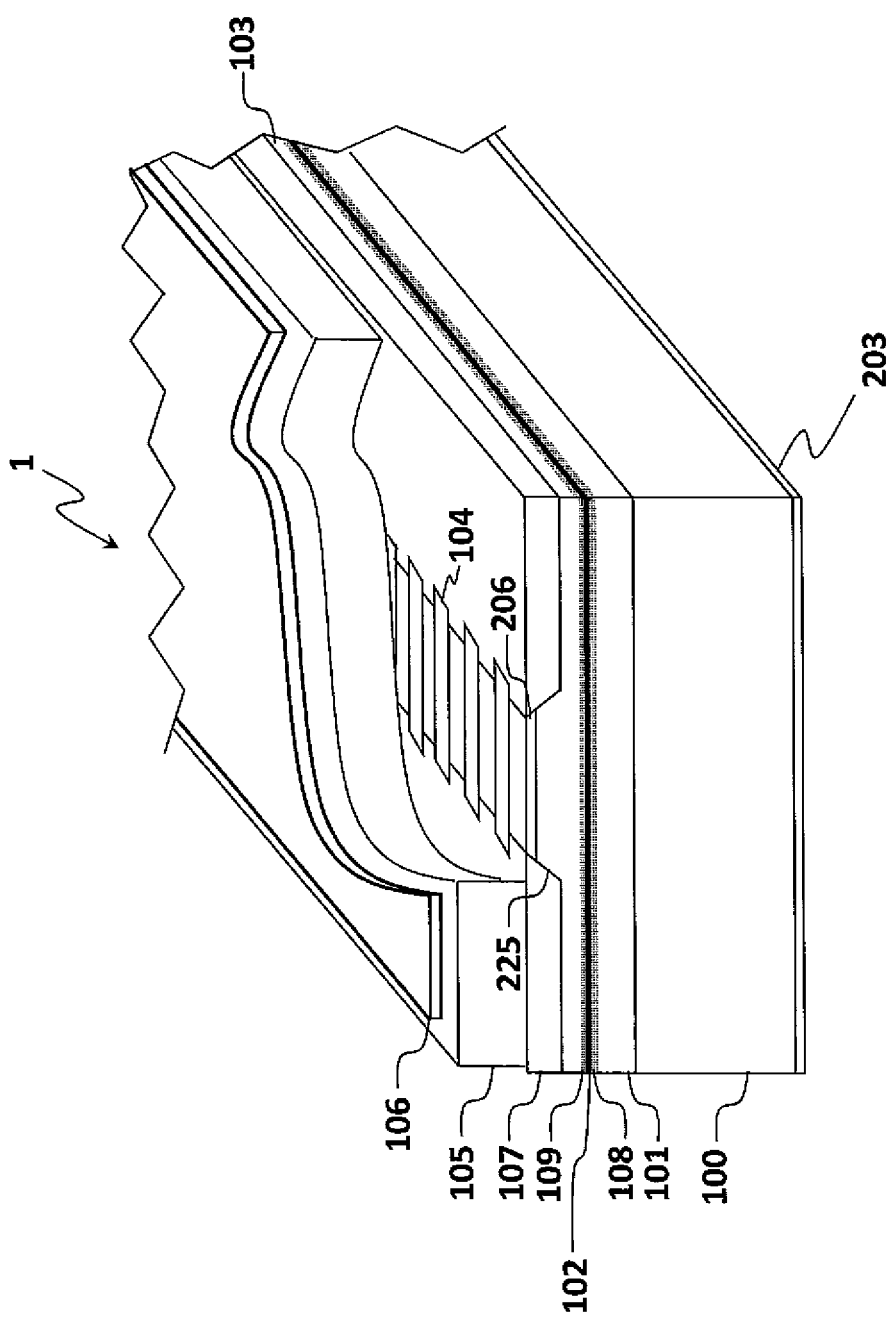
FIG. 1 schematically depicts an exemplary complex-coupled distributed feedback laser device with a transparent conductive cladding layer.
Figure 2:
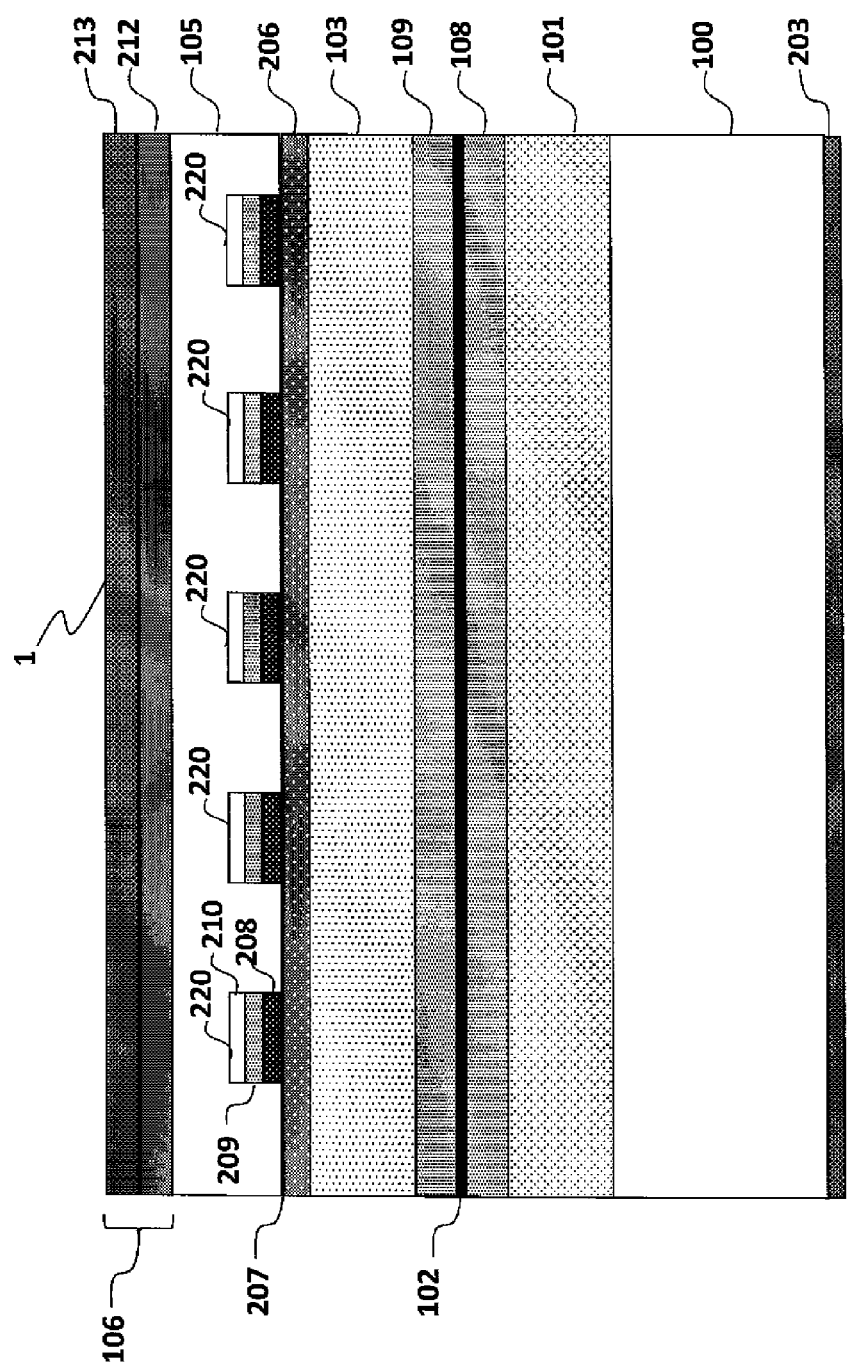
FIG. 2 shows longitudinal cross sectional view of an exemplary laser device near the center of the laser device.
Figure 3:
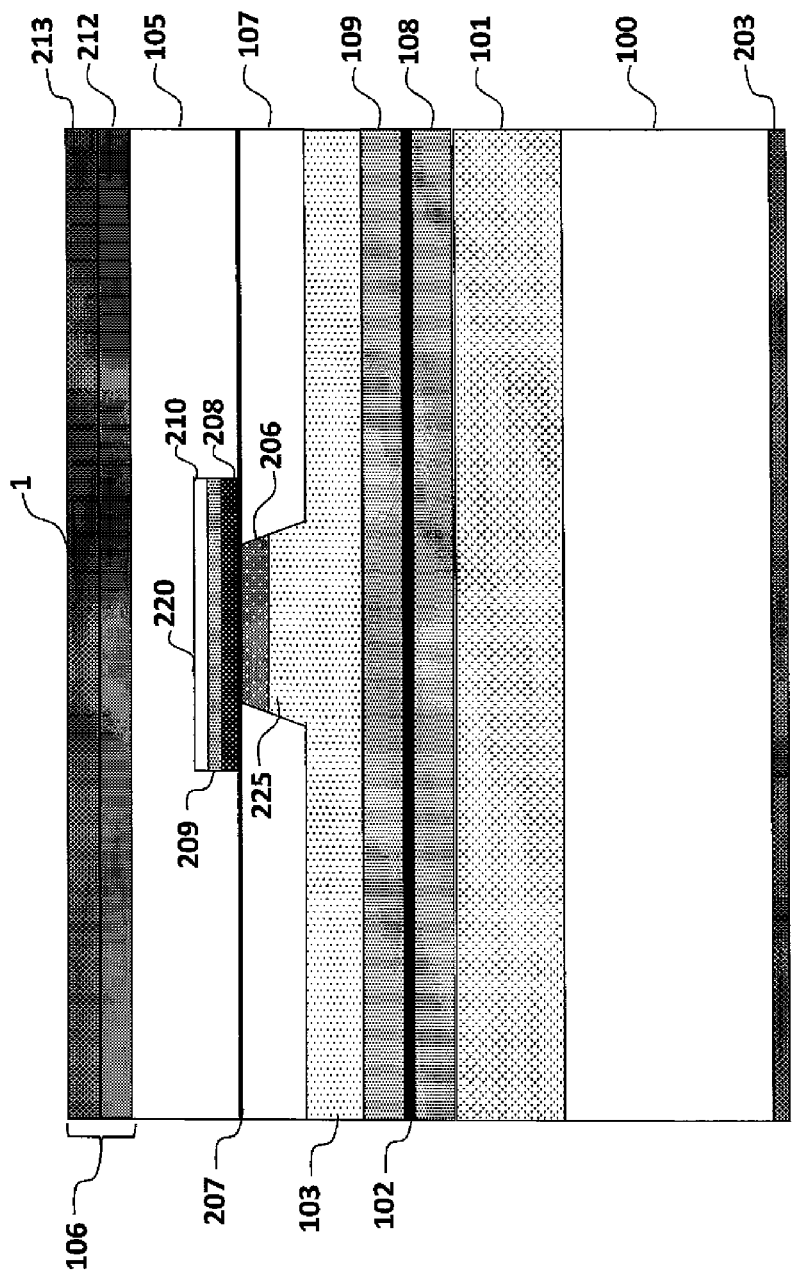
FIG. 3 shows a lateral cross sectional view of an exemplary laser according to the invention.
Figure 5:
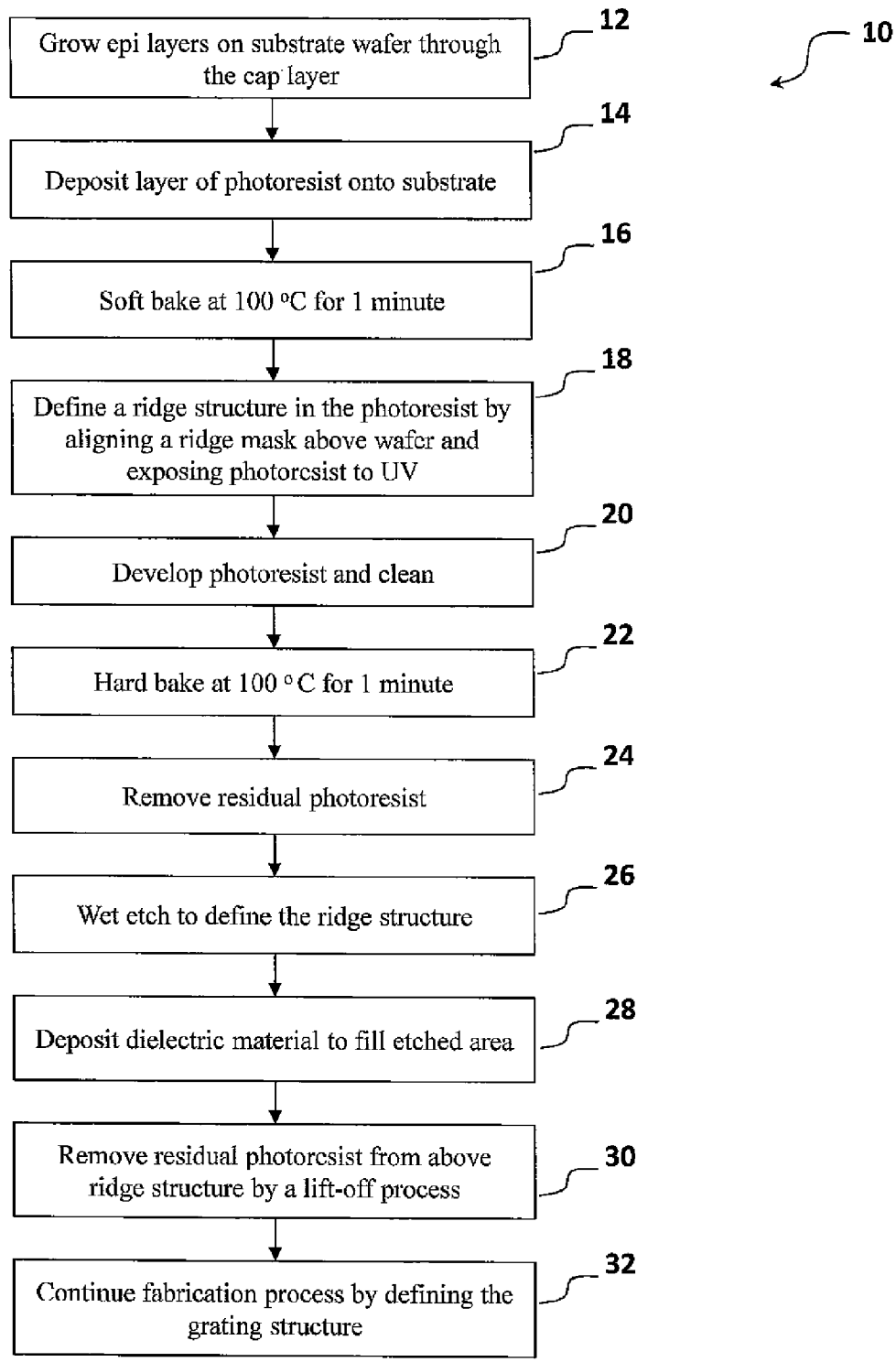
FIG. 5 is a flow diagram of a preferred method of manufacture showing the steps through defining the grating structure.

A preferred embodiment complex-coupled distributed feedback (CC-DFB) laser device is shown in FIGS. 1-3, FIG. 1 showing a front perspective view, FIG. 2 showing a schematic of a centrally located cross-section view from one side and FIG. 3 showing a front cross section view from the front facet of the device. CC-DFB laser device 1 comprises substrate 100 adjacent a bottom electrode 203, lower cladding layer 101, active region 102 embedded in a graded refractive index waveguide, upper cladding region 103, complex-coupled grating structure 104 along a cavity length direction, a transparent and conductive cladding layer 105 over upper graded refractive index layer 206 and a top electrode 106 defined for current injection into active region 102. Notably, complex-coupled grating structure 104 is limited to a thin layer, has a uniform corrugation period and comprises two sections, one section filled by a highly absorptive metal stack and the other section including the transparent and conductive cladding material. Lateral optical and current confinement is achieved by a low refractive index and a non-conductive current blocking layer 107 made of a dielectric material. First barrier region 108 and second barrier region 109 surround active region 102 providing for vertical optical waveguide confinement.

According to the preferred embodiment, substrate 100 comprises a heavily doped N-type GaAs substrate, on which a N-doped AlGaAs cladding layer of thickness about 1.9 μm and 55% aluminum mole fraction defines lower cladding layer 101. First barrier region 108 of AlGaAs is provided over lower cladding layer 101 and has a graded refractive index with varying aluminum mole fraction from 55% to 30%. The thickness of first barrier region 108 is about 0.1 μm. Active region 102 overlies first barrier region 108 and comprises a tensile strained thin layer of gallium arsenide phosphate material forming a quantum well tailored so as to provide a first transition energy of about 1.59 eV which corresponds to a laser emission wavelength near 0.78 μm. The quantum well is a potential well that confines carriers, which were originally free to move in three dimensions, to occupy only a planar region. The effects of quantum confinement take place when the quantum well thickness becomes comparable to the de Broglie wavelength of the carrier, generally electrons and holes.

In an alternate embodiment, active region 102 comprises multiple quantum wells.

Second barrier region 109 of AlGaAs having a graded refractive index separate with varying aluminum mole fraction from 30% to 55% is provided over active region 102. The thickness of the second barrier region is also about 0.1 μm.

Upper cladding region 103 comprises a layer of P-doped AlGaAs of thickness about 0.6 μm having an aluminum mole fraction of about 55%. Upper graded refractive index layer 206 of P-doped AlGaAs having thickness about 0.08 μm and varying mole fraction from about 55% to about 5% is provided over upper cladding region 103. Cap layer 207 of P-doped GaAs having thickness of about 0.015 μm is above upper graded refractive index layer 206. Set of metal stacks 220 comprising titanium layer 208, chrome layer 209 and gold layer 210 of respective thicknesses of about 50 Å, about 200 Å and about 50 Å is defined above cap layer 207. Current blocking layer 107 is a suitable dielectric material such as silicon nitride.

Complex-coupled grating structure 104 is defined by set of metal stacks 220 and has uniform corrugation period selected so as to define a first-order grating for a selected lasing wavelength. The composition and the thickness of the set of metal stacks, and the distance to active region 102 determine the overlap of the optical mode with the set of metal stacks, the resulting absorption losses from the metal and the desired grating strength. Opposed to a semiconductor material the absorption loss in metal cannot be saturated. This suppresses non-linear effects like self-pulsations or a bi-stable threshold region as shown, for example, by M. Achtenhagen, "Experimental and Theoretical Stability Analysis of Complex-Coupled DFB Laser Diodes with and without External Feedback", Thesis no. 1475, Swiss Federal Institute of Technology, Lausanne 1996.

Continuing further with FIGS. 1, 2 and 3, transparent and conductive cladding layer 105 of Indium-Tin oxide (ITO) of about 0.65 μm thickness is deposited over complex-coupled grating structure 104 and set of metal stacks 220. Top electrode 106 comprises electrical contact layer 212 and electroplated gold layer 213. Bottom electrode 203 comprises a an electrical contact preferably made of alternative layers of germanium, nickel and gold and defines the bottom surface of the laser device. Electrical contact layer 212 further comprises a nickel layer of thickness about 1000 Å and a gold layer of thickness about 3000 Å. Electro-plated gold layer 213 of 1 μm to 2 μm thickness is electro-plated over the electrical contact layer and defines the top surface of the laser device. Transparent and conductive cladding layer 105 is transparent at the laser emission wavelength and conducts electric current from the electrical contact layer to cap layer 207.

The laser optical mode is confined vertically by first bather region 108, second barrier region 109 and upper graded refractive index layer 206 and confined laterally by current blocking layer 107. A laser cavity is formed between a front cleaved facet on the front face of the CC-DFB laser device and a back cleaved facet on the back face. The optical axis of the laser optical mode centers in active region 102 near trapezoidal-shaped ridge structure 225 and extends parallel to the ridge structure between the front face and the back face.

The vertical confinement of the laser optical mode is such that the decaying tail of the laser optical mode overlaps with set of metal stacks and the grating structure characterized by a complex-coupling coefficient. A narrow opening in current blocking layer 107 laterally horizontally confines the optical mode because of the refractive index differenced and gain difference between current blocking layer 107 and upper cladding layer 103 and confines the injection current to a small volume of the CC-DFB laser device. Since the injected current is confined to a small volume, a well defined optical gain area is developed only in the active region and underneath the metal grating layer. Together with the refractive index difference, a combined index and gain-guided optical waveguide is formed, which defines the propagating mode in the laser cavity.

The grating structure consists of sections of metal stack alternated with sections of ITO where the metal stack includes layers of titanium, chrome and gold and is characterized by its complex-coupling coefficient. In alternate embodiments, the metal stack may consist of a plurality of different metals with different thicknesses resulting in different values for the complex-coupling coefficient. The grating structure in the preferred embodiment has a corrugation period of about 1100 Å for a 780 nm CC-DFB laser device. Beneficially, the grating structure is a first-order uniform grating with a duty ratio of between about 20% and 40% and preferably about 25%. In alternate embodiments, the grating structure is chirped or comprises a higher-order grating.

The interference between the forward and backward propagating modes in the laser cavity forms a standing wave. The exact phase of the standing wave depends on the grating location as well as on the partial reflection at the cleaved facets. Due to the symmetry between forward and backward propagating modes there are two standing waves corresponding to two principle emission wavelengths.

As shown in FIG. 4A, one standing wave 250 has a large overlap with the loss regions 270, having small effective gain and unable to reach threshold for laser action. The loss regions are defined by the set of metal stacks in the grating structure. Another standing wave 260 has small or no overlap with the loss regions 270 as shown in FIG. 4B, having a large effective gain in comparison to the situation of FIG. 4A, with an achievable threshold current for laser operation at the effective laser wavelength. In another advantage of the present invention, the use of metal stacks prevents the loss from saturation otherwise normally observed in semiconductor material. Non-linear dynamic effects are therefore not expected, which greatly improves the stability of the laser device.

Preferred embodiment CC-DFB laser devices, as in FIGS. 1-4, are made in a fabrication process including the steps shown in FIGS. 5-8. Beginning with step 12 of fabrication process 10 in FIG. 5, a wafer is preferably grown by epitaxial layers in a MOCVD reactor, layering in order: substrate 100, lower cladding layer 101, active region 102, first barrier region 108, active region 102, second barrier region 109, upper cladding layer 103, upper graded refractive index layer 206 and cap layer 207.

After the wafer is grown, the ridge structure defining the waveguide is made. At step 14, a thin layer of photoresist is deposited and at step 16, the photoresist is soft baked at 100° C. for 1 minute. At step 18, a suitable mask, such as a chrome mask is aligned above the wafer in a mask aligner, and a ridge structure is transferred into the photoresist by UV exposure. At step 20, the exposed photoresist is developed with a developers solution and wash and followed with a hard bake at 100° C. for 1 minute in step 22. At step 24, an ashing process is performed to remove residual photoresist. At step 26, a chemical wet etch removes a portion of the upper cladding layer 103, a portion of the upper graded refractive index layer 206, and a portion of the cap layer leaving the ridge structure of about 2000 Å height and of about 2 to 3.5 μm width along the direction of the optical axis of the laser. At step 28, the dielectric material is deposited onto the wafer with a thickness of 2000 Å, and at step 30, a lift-off process is applied to remove the remaining photoresist from above the ridge structure, exposing the cap layer above and resulting in an approximately planar top surface. At step 32, the fabrication process 10 continues as shown in FIG. 6, wherein the grating structure is fabricated on the planar top surface.

Figure 6:
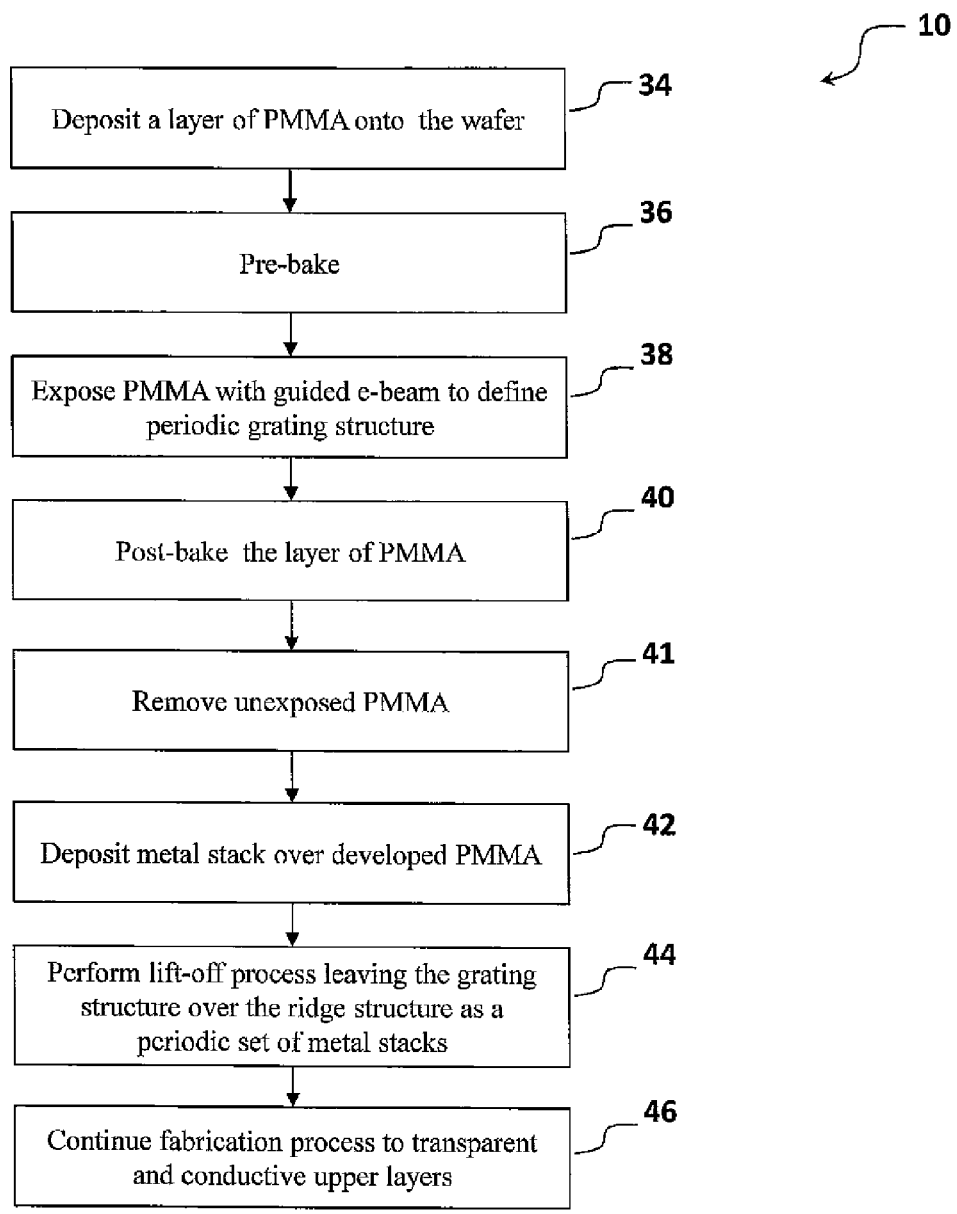
FIG. 6 is a flow diagram of a preferred method of manufacture showing the steps of fabricating the grating structure.

Moving to FIG. 6, step 32 of fabricating the grating structure is explained and continues fabrication process 10. At step 34, the grating structure is defined by depositing a thin layer of poly(methyl methacrylate) (PMMA) of thickness less than 1 μm onto the wafer, for example by a spinning process. After a pre-bake at step 36, the PMMA is exposed by a guided electron beam, at step 38, followed by step 40 of performing a post bake and step 41 of removing unexposed PMMA. Steps 36, 38, 40 and 41 result in a periodic stripe pattern of developed PMMA according to the desired corrugation period. At step 42, a metal stack of titanium, chrome and gold is deposited over the developed PMMA. A consequent lift-off process is performed at step 44, which results in the grating structure defined as a periodic set of metal stacks fabricated over the ridge structure and in contact with cap layer 207 and in contact with the dielectric material. At step 46, fabrication process 10 continues, as shown in FIG. 7, by adding the transparent and conductive upper layers.

Figure 7:
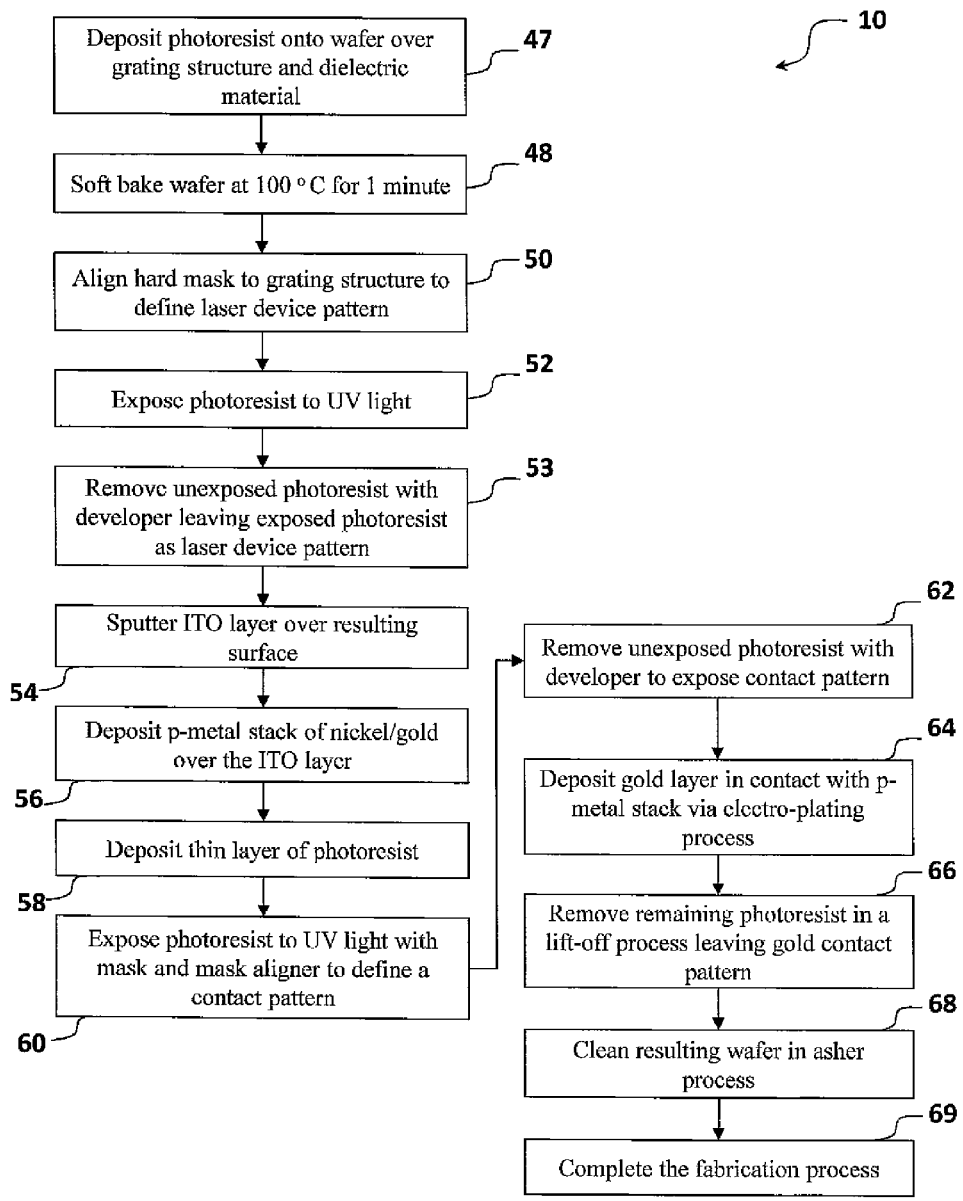
FIG. 7 is a flow diagram of a preferred method of manufacture showing the steps of fabricating the transparent and conductive cladding layer and fabricating the metal layers.

In FIG. 7, at step 47, a thin layer of photoresist is deposited over the grating structure and dielectric material, and at step 48, soft baked at 100° C. for 1 minute. At step 50, a suitable hard mask is aligned using a mask aligner and at step 52, a device pattern is transferred into the photoresist by UV exposure to define strips of laser devices. At step 53, unexposed photoresist is removed using a developer leaving exposed photoresist material over the device pattern near the top side edges of each strip of laser devices.

Figure 8:
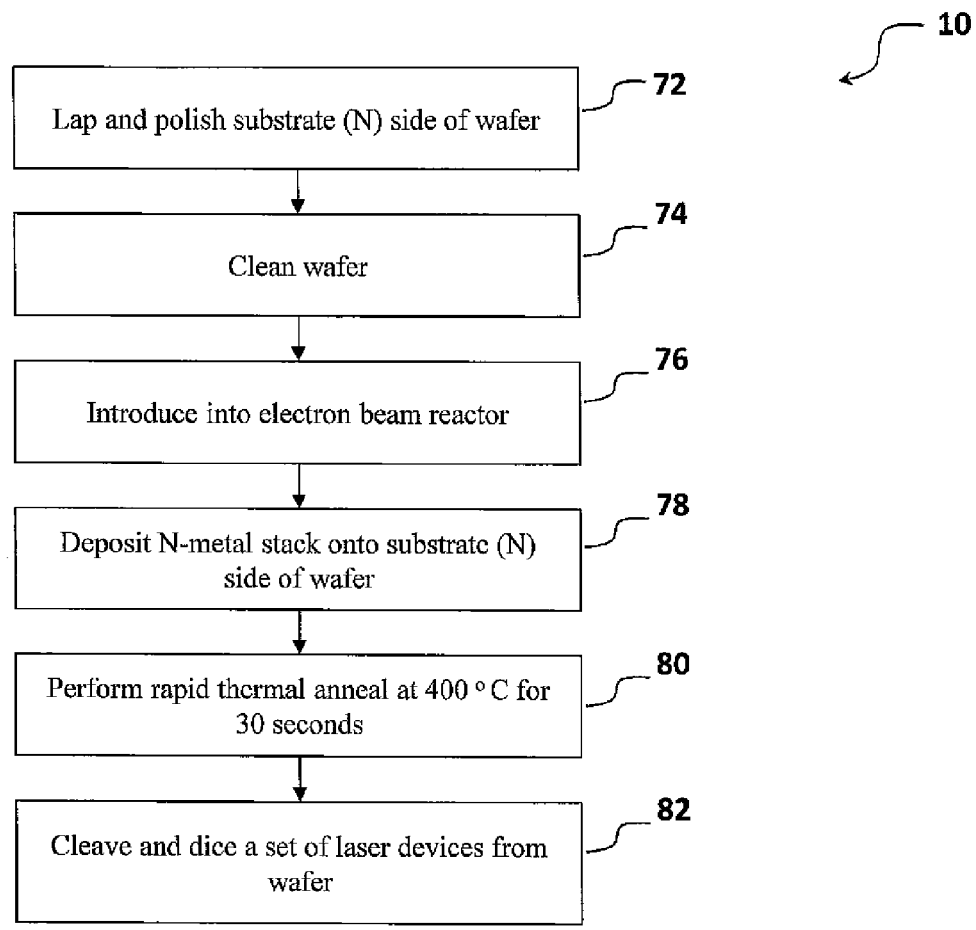
FIG. 8 is a flow diagram of a preferred method of manufacture showing the steps of applying a metal layer to the substrate through dicing and cleaving the laser devices.

At step 54, a 0.65 μm thick layer of indium tin oxide (ITO) is then sputtered over the resulting surface from step 53. At step 56, a P-metal stack consisting of nickel and gold layers is deposited over the ITO using an electron beam reactor. At step 58, a thin layer of photoresist is deposited and at step 60, the thin layer of photoresist is exposed with UV light using a mask and mask aligner to define a contact pattern. At step 62, a developer is used to remove unexposed photoresist and to expose the P-metal stack according to the contact pattern. At step 64, the wafer is placed in a gold electro-plating bath which deposits a 1.5 μm thick gold layer in contact with the P-metal stack. After the gold electro-plating process the remaining phoresist is removed in a lift-off process at step 66 and at step 68 the wafer is cleaned in an asher. The fabrication process 10 continues to completion at step 69 as shown in FIG. 8.

A wafer holder serves to mount the wafer P-side down. In FIG. 8, at step 72, the N-side is lapped and polished to a thickness of 120 μm. After polishing the wafer is cleaned at step 74 and introduced into an electron beam reactor at step 76. At step 78, a N-metal stack consisting of alternatively layers of germanium/nickel/gold/nickel/germanium/gold with thicknesses of 50 Å/100 Å/1000 Å/200 Å/200 Å/2000 Å is uniformly deposited onto the polished and cleaned N-side surface. At step 80, a thermal rapid annealing of the wafer is performed at 400° C. for 30 seconds to complete the laser fabrication process. At step 82, the wafer is cleaved and diced into a set of CC-DFB laser devices.

While the laser device described above is fabricated on an N-type substrate wafer, alternatively, a complimentary structure may be fabricated on a P-type wafer. Furthermore in the above described embodiment the semiconductor laser comprises a buried waveguide structure. It is also contemplated that a semiconductor laser device in alternative embodiments may be a ridge waveguide device. A ridge waveguide laser may also comprise a metal grating, uniform or chirped.

In the preferred embodiment fabrication process, the grating structure is written using a guided electron beam. In an alternate embodiment fabrication process, holographic exposure is used to write the grating lines into the photoresist. Furthermore, the preferred embodiment fabrication process includes processing the metal grating by a lift-off method. In an alternate embodiment a complimentary process may be applied wherein a uniform metal stack is deposited on top of the cap layer and dielectric material. A thin layer of PMMA is formed above the metal stack using a spinner. A defined grating structure is written by guided electron beam or by a holographic method. A dry or wet chemical etch process then transfers the grating lines through the metal by using the PMMA as a mask.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A single frequency complex-coupled distributed feedback semiconductor laser device having a single optical lasing mode along an optical axis, comprising:
   a substrate having a first metal conductive layer on an exterior side and a first cladding region on an interior side;
   a first barrier region adjacent the first cladding region;
   an active region adjacent the first barrier region comprising at least one quantum well;
   a second barrier region adjacent the active region;
   a second cladding region adjacent the second barrier region;
   a graded refractive index region adjacent the second cladding region;
   a complex-coupled grating adjacent the graded refractive index region further comprising a set of periodically placed metal stacks;
   a third cladding region adjacent the complex-coupled grating and the graded refractive index region comprising a non-epitaxially grown transparent and conductive material;
   a second metal conductive layer adjacent the third cladding region;
   a means for providing lateral carrier confinement; and,
   a means for providing lateral optical confinement and vertical optical confinement for the single optical lasing mode.

2. A laser device as in claim 1 wherein the means for providing a lateral carrier confinement and the means for providing lateral optical confinement comprises a dielectric material laterally adjacent to a ridge structure formed along the optical axis in the second cladding region.

3. A laser device as in claim 1 wherein the means for providing vertical optical confinement comprises a partial impurity diffused into the first cladding region, the first barrier region, the second barrier region, the second cladding region and the graded refractive index region.

4. A laser device as in claim 1 wherein the substrate consists essentially of the compound GaAs.

5. A laser device as in claim 4 wherein the first cladding layer, the second cladding layer, the first barrier region, and the second barrier region comprise in part the compound AlGaAs.

6. A laser device as in claim 4 capable of generating light in the wavelength range of 0.6 micrometers to 1.2 micrometers.

7. A laser device as in claim 1 wherein the semiconductor consists essentially of the compound InP.

8. A laser device as in claim 7 wherein the first cladding layer, the second cladding layer, the first barrier region, and the second barrier region comprise in part the compound InGaAsP.

9. A laser device as in claim 6 capable of generating light in the wavelength range of 1.3 micrometers to 1.6 micrometers.

10. A laser device as in claim 1 wherein the semiconductor consists essentially of one of the group of GaN, Sapphire and II-VI compounds.

11. A laser device as in claim 10 capable of generating light in the wavelength range of 0.3 micrometers to 0.5 micrometers.

12. A laser device as in claim 2 wherein the dielectric material consists essentially of the compound SiN.

13. A laser device as in claim 1 wherein the third cladding layer consists essentially of the compound ITO.

14. A laser device as in claim 1 wherein the set of periodically placed metal stacks comprise a first metal layer consisting essentially of titanium, a second metal layer consisting essentially of chrome and a third metal layer consisting essentially of gold.

* * * * *